United States Patent
Gebeyehu et al.

(10) Patent No.: US 10,958,218 B2
(45) Date of Patent: *Mar. 23, 2021

(54) APPARATUS AND METHODS FOR BIAS SWITCHING OF POWER AMPLIFIERS

(71) Applicant: Skyworks Solutions, Inc., Irvine, CA (US)

(72) Inventors: Netsanet Gebeyehu, San Jose, CA (US); Srivatsan Jayaraman, Santa Clara, CA (US); Edward James Anthony, Robins, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/867,821

(22) Filed: May 6, 2020

(65) Prior Publication Data

US 2020/0336108 A1 Oct. 22, 2020

Related U.S. Application Data

(63) Continuation of application No. 15/941,464, filed on Mar. 30, 2018, now Pat. No. 10,666,200.

(Continued)

(51) Int. Cl.
*H03F 3/04* (2006.01)
*H03F 1/02* (2006.01)
(Continued)

(52) U.S. Cl.
CPC ......... *H03F 1/0216* (2013.01); *H03F 1/0227* (2013.01); *H03F 1/0266* (2013.01);
(Continued)

(58) Field of Classification Search
CPC .......... H03F 1/0216; H03F 3/245; H03F 3/24; H03F 1/0266; H03F 3/195; H03F 1/302;
(Continued)

(56) References Cited

U.S. PATENT DOCUMENTS 6,144,706 A 11/2000 Sato et al.
6,331,799 B1 12/2001 Miyazawa
(Continued)

FOREIGN PATENT DOCUMENTS

CN 1790920 A 6/2006
CN 101902207 A 12/2010
(Continued)

OTHER PUBLICATIONS

International Search Report and Written Opinion of the International Searching Authority dated Jul. 20, 2018 for International Patent Application No. PCT/US2018/025757 filed on Apr. 2, 2018, 11 pages.

(Continued)

*Primary Examiner* — Khanh V Nguyen
(74) *Attorney, Agent, or Firm* — Knobbe, Martens, Olson & Bear, LLP

(57) ABSTRACT

Apparatus and methods for bias switching of power amplifiers are provided herein. In certain configurations, a power amplifier system includes a power amplifier that provides amplification to a radio frequency (RF) signal, a power management circuit that controls a voltage level of a supply voltage of the power amplifier, and a bias control circuit that biases the power amplifier. The power management circuit is operable in multiple supply control modes, such as an average power tracking (APT) mode and an envelope tracking (ET) mode. The bias control circuit is configured to switch a bias of the power amplifier based on the supply control mode of the power management circuit.

20 Claims, 9 Drawing Sheets

Related U.S. Application Data

(60) Provisional application No. 62/481,368, filed on Apr. 4, 2017.

(51) Int. Cl.

| | | |
|---|---|---|
| *H03F 3/193* | (2006.01) | |
| *H03F 3/19* | (2006.01) | |
| *H03F 3/24* | (2006.01) | |
| *H03F 1/56* | (2006.01) | |
| *H03F 3/195* | (2006.01) | |
| *H04B 1/04* | (2006.01) | |
| *H04B 1/3827* | (2015.01) | |
| *H01L 25/065* | (2006.01) | |
| *H03F 1/30* | (2006.01) | |
| *H03F 3/191* | (2006.01) | |

(52) U.S. Cl.
CPC ............. *H03F 1/56* (2013.01); *H03F 3/19* (2013.01); *H03F 3/193* (2013.01); *H03F 3/195* (2013.01); *H03F 3/24* (2013.01); *H03F 3/245* (2013.01); *H04B 1/04* (2013.01); *H01L 25/0655* (2013.01); *H01L 2224/16227* (2013.01); *H01L 2224/48227* (2013.01); *H01L 2924/15313* (2013.01); *H01L 2924/19041* (2013.01); *H01L 2924/19042* (2013.01); *H01L 2924/19043* (2013.01); *H01L 2924/19105* (2013.01); *H03F 1/302* (2013.01); *H03F 3/04* (2013.01); *H03F 3/191* (2013.01); *H03F 2200/102* (2013.01); *H03F 2200/105* (2013.01); *H03F 2200/222* (2013.01); *H03F 2200/318* (2013.01); *H03F 2200/336* (2013.01); *H03F 2200/451* (2013.01); *H04B 1/3827* (2013.01); *H04B 2001/045* (2013.01); *H04B 2001/0416* (2013.01)

(58) Field of Classification Search
CPC ......... H03F 2200/336; H03F 2200/105; H03F 2200/222; H03F 3/191; H03F 3/19; H03F 1/56; H03F 3/193; H03F 1/0227; H03F 2200/451; H03F 2200/318; H03F 3/04; H03F 2200/102; H04B 2001/0416; H04B 1/04; H04B 2001/045; H04B 1/3827; H01L 2924/19043; H01L 25/0655; H01L 2224/48227; H01L 2924/15313; H01L 2924/19042; H01L 2924/19105; H01L 2224/16227; H01L 2924/19041
USPC .................. 330/127, 129, 285, 296, 297
See application file for complete search history.

(56) References Cited

U.S. PATENT DOCUMENTS

| | | | |
|---|---|---|---|
| 6,433,641 B1 | 8/2002 | Sakuno | |
| 6,529,716 B1 | 3/2003 | Eidson et al. | |
| 6,714,081 B1 | 3/2004 | Xu | |
| 6,771,130 B2 | 8/2004 | Hasegawa et al. | |
| 6,781,455 B2 | 8/2004 | Kim | |
| 6,784,748 B1 | 8/2004 | Canyon et al. | |
| 7,071,775 B2 | 7/2006 | Gailus et al. | |
| 7,154,336 B2 | 12/2006 | Maeda | |
| 7,482,875 B2 | 1/2009 | Tanoue et al. | |
| 7,821,335 B2 | 10/2010 | Shiramizu et al. | |
| 7,869,775 B2 | 1/2011 | Alon et al. | |
| 8,093,952 B2 | 1/2012 | Behzad et al. | |
| 8,098,093 B1 | 1/2012 | Li | |
| 8,183,917 B2 | 5/2012 | Drogi et al. | |
| 8,217,716 B2 | 7/2012 | Tanaka et al. | |
| 8,223,886 B2* | 7/2012 | Kitamura ............. | H04L 27/20 375/297 |
| 8,416,023 B2 | 4/2013 | Van Rijs et al. | |
| 8,598,950 B2 | 12/2013 | Khesbak | |
| 8,717,100 B2 | 5/2014 | Reisner et al. | |
| 8,717,101 B2 | 5/2014 | Li et al. | |
| 8,761,698 B2 | 6/2014 | Langer | |
| 8,797,103 B2 | 8/2014 | Kaczman et al. | |
| 9,219,877 B2 | 12/2015 | Holland | |
| 9,362,870 B2 | 6/2016 | Lam | |
| 9,455,669 B2 | 9/2016 | Modi et al. | |
| 9,496,825 B2 | 11/2016 | Henshaw et al. | |
| 9,608,576 B2 | 3/2017 | Lam | |
| 9,660,589 B2 | 5/2017 | Kondo et al. | |
| 9,819,310 B2 | 11/2017 | Wu et al. | |
| 9,876,471 B2 | 1/2018 | Modi et al. | |
| 10,003,308 B2 | 6/2018 | Lam | |
| 10,097,148 B2* | 10/2018 | Ishihara ............. | H03F 3/191 |
| 10,666,200 B2 | 5/2020 | Gebeyehu et al. | |
| 2004/0224649 A1 | 11/2004 | Shamsaifar | |
| 2005/0032488 A1 | 2/2005 | Pehike et al. | |
| 2005/0134374 A1 | 6/2005 | Hench et al. | |
| 2005/0280466 A1 | 12/2005 | Gailus et al. | |
| 2008/0180169 A1 | 7/2008 | Ripley et al. | |
| 2008/0194216 A1 | 8/2008 | Rofougaran | |
| 2009/0195318 A1 | 8/2009 | Kang et al. | |
| 2010/0045384 A1 | 2/2010 | Fisher et al. | |
| 2010/0156539 A1 | 6/2010 | Ha et al. | |
| 2011/0316636 A1 | 12/2011 | Zhao et al. | |
| 2012/0269240 A1 | 10/2012 | Balteanu et al. | |
| 2012/0286873 A1 | 11/2012 | Li et al. | |
| 2013/0116017 A1 | 5/2013 | Zhang et al. | |
| 2013/0141167 A1 | 6/2013 | Kim et al. | |
| 2014/0091440 A1 | 4/2014 | Nair et al. | |
| 2014/0266429 A1 | 9/2014 | Khlat et al. | |
| 2014/0306756 A1 | 10/2014 | Henshaw | |
| 2015/0077187 A1 | 3/2015 | Lam et al. | |
| 2015/0180518 A1 | 6/2015 | Whittaker | |
| 2015/0326182 A1 | 11/2015 | Chen et al. | |
| 2017/0093339 A1 | 3/2017 | Wu et al. | |

FOREIGN PATENT DOCUMENTS

| | | |
|---|---|---|
| JP | 2000-252766 | 9/2000 |
| JP | 2007-019784 | 1/2007 |
| TW | I344263 | 6/2011 |
| TW | 201249100 A1 | 12/2012 |
| TW | 201316677 A1 | 4/2013 |
| WO | WO 2012/158423 A2 | 11/2012 |

OTHER PUBLICATIONS

Xu, Jinbiao, Agilent Technologies, Practical Digital Pre-Distortion Technologies for PA Linearization in 3GPP LTE dated May 26, 2010, in 24 pages.
Written Opinion for Singapore International Application No. 11201908970T dated Jul. 27, 2020, in 4 pages.

* cited by examiner

APPARATUS AND METHODS FOR BIAS SWITCHING OF POWER AMPLIFIERS

CROSS-REFERENCE TO RELATED APPLICATIONS

This application is a continuation of U.S. patent application Ser. No. 15/941,464, filed Mar. 30, 2018 and titled "APPARATUS AND METHODS FOR BIAS SWITCHING OF POWER AMPLIFIERS," which claims the benefit of priority under 35 U.S.C. § 119 of U.S. Provisional Patent Application No. 62/481,368, filed Apr. 4, 2017 and titled "APPARATUS AND METHODS FOR BIAS SWITCHING OF POWER AMPLIFIERS," which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in radio frequency (RF) communication systems to amplify RF signals for transmission via antennas. It can be important to manage the power of RF signal transmissions to prolong battery life and/or provide a suitable transmit power level.

Examples of RF communication systems with one or more power amplifiers include, but are not limited to mobile phones, tablets, base stations, network access points, laptops, and wearable electronics. Power amplifiers provide amplification to RF signals, which can have a frequency in the range from about 30 kHz to 300 GHz, for instance, in a range from about 450 MHz to about 90 GHz for certain communication standards.

SUMMARY

In certain embodiments, the present disclosure relates to a mobile device including a power amplifier configured to amplify a radio frequency signal, a power management circuit configured to control a voltage level of a supply voltage of the power amplifier, and a bias control circuit. The power management circuit is operable in a selected supply control mode chosen from a plurality of supply control modes, and the bias control circuit is configured to switch a bias of the power amplifier based on the selected supply control mode of the power management circuit.

In a number of embodiments, the plurality of supply control modes includes an average power tracking mode and an envelope tracking mode.

In some embodiments, the bias control circuit is operable to control a bias impedance of the power amplifier based on the selected supply control mode.

In various embodiments, the bias control circuit is configured to receive a control signal indicating the selected supply control mode of the power management circuit. According to several embodiments, the bias control circuit is configured to receive the control signal over a serial interface. In accordance with a number of embodiments, the serial interface is a mobile industry processor interface radio frequency front-end bus.

In some embodiments, the power amplifier includes a plurality of bias networks, the bias control circuit is operable to control the plurality of bias networks based on the selected supply control mode. According to a number of embodiments, the bias control circuit selectively activates different combinations of the plurality of bias networks based on the selected supply control mode. In accordance with various embodiments, the plurality of bias networks includes a first bias network activated in a first supply control mode and deactivated in a second supply control mode. According to several embodiments, the first bias network includes at least one of an amplitude distortion compensation circuit or a phase distortion compensation circuit.

In various embodiments, the power amplifier includes a first stage and a second stage subsequent to the first stage. In accordance with a number of embodiments, the power amplifier includes a first plurality of bias networks configured to bias the first stage, and a second plurality of bias networks configured to bias the second stage, and the bias control circuit is operable to control the first plurality of bias networks and the second plurality of bias networks based on the selected supply control mode. According to several embodiments, the bias control circuit selectively activates different combinations of the first plurality of bias networks and the second plurality of bias networks based on the selected supply control mode In certain embodiments, the present disclosure relates to a packaged module. The packaged module includes a package substrate, a supply pin configured to receive a supply voltage from an external power management circuit, a first die attached to the package substrate and including a power amplifier configured to amplify a radio frequency signal, and a second die attached to the package substrate and including a bias control circuit configured to switch a bias of the power amplifier based on a control signal indicating a selected mode of controlling the supply voltage.

In various embodiments, the selected supply control mode indicates one of an average power tracking mode or an envelope tracking mode.

In several embodiments, the bias control circuit is operable to control a bias impedance of the power amplifier based on the selected supply control mode.

In a number of embodiments, the first die and the second die are implemented in different processing technologies. According to several embodiments, the first die is a gallium arsenide die and the second die is a complementary metal oxide semiconductor die or silicon on insulator die.

In various embodiments, the second die includes a serial interface configured to receive the control signal. In accordance with several embodiments, the serial interface is a mobile industry processor interface radio frequency front-end bus.

In some embodiments, the power amplifier includes a plurality of bias networks, and the bias control circuit is operable to control the plurality of bias networks based on the selected supply control mode. According to a number of embodiments, the bias control circuit selectively activates different combinations of the plurality of bias networks based on the selected supply control mode. In accordance with various embodiments, the plurality of bias networks includes a first bias network activated in a first supply control mode and deactivated in a second supply control mode. According to several embodiments, the first bias network includes at least one of an amplitude distortion compensation circuit or a phase distortion compensation circuit.

In a number of embodiments, the power amplifier includes a first stage and a second stage subsequent to the first stage. In accordance with several embodiments, the power amplifier includes a first plurality of bias networks configured to bias the first stage, and a second plurality of bias networks configured to bias the second stage, and the bias control circuit is operable to control the first plurality of bias networks and the second plurality of bias networks based on the selected supply control mode. According to various embodiments, the bias control circuit selectively activates different combinations of the first plurality of bias networks and the second plurality of bias networks based on the selected supply control mode In certain embodiments, the present disclosure relates to a method of power amplifier biasing. The method includes amplifying a radio frequency signal using a power amplifier, controlling a voltage level of a supply voltage of the power amplifier using a power management circuit, operating the power management circuit in a selected supply control mode chosen from a plurality of supply control modes, and switching a bias of the power amplifier based on the selected supply control mode using a bias control circuit.

In various embodiments, the method further includes controlling a bias impedance of the power amplifier based on the selected supply control mode using the bias control circuit.

In several embodiments, the method further includes receiving a control signal indicating the selected supply control mode over a serial interface.

In some embodiments, the method further includes switching the bias of the power amplifier includes selectively activating one or more of a plurality of bias networks of the power amplifier based on the selected supply control mode. According to a number of embodiments, the method further includes activating different combinations of the plurality of bias networks based on the selected supply control mode.

DETAILED DESCRIPTION OF EMBODIMENTS

Figure 1:
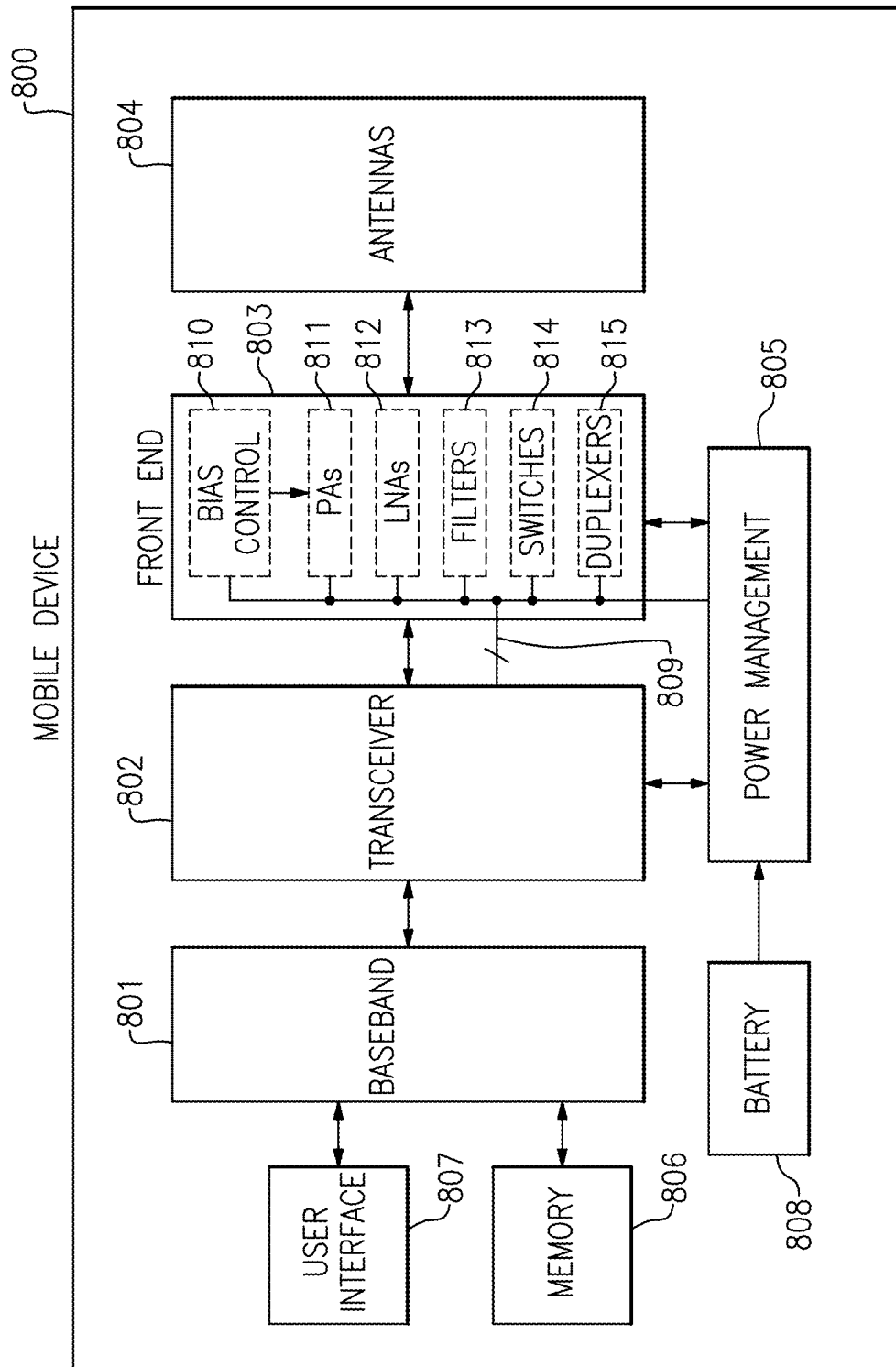
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

In mobile applications, such as cellular communication systems, it is important to prolong battery lifetime. One operation that consumes a significant amount of battery charge is power amplification.

To increase efficiency and thereby extend battery life, an RF communication system can include a power management circuit for controlling a voltage level of the power amplifier's supply voltage. For example, the power management circuit can employ various power management techniques to change the voltage level of the power amplifier's supply voltage over time to improve the power amplifier's power added efficiency (PAE), thereby reducing power dissipation.

One technique for improving efficiency of a power amplifier is average power tracking (APT), in which a DC-to-DC converter or other suitable voltage regulator is used to generate a supply voltage for a power amplifier based on the power amplifier's average output power.

Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

A power amplifier optimized for APT performance can exhibit sub-optimal performance for ET. Similarly, a power amplifier optimized for ET performance can exhibit sub-optimal performance for APT. Such power amplifier design trade-offs can be particularly exacerbated in applications in which the power amplifier is specified to support full transmit power without back off for both ET and APT modes.

Apparatus and methods for bias switching of power amplifiers are provided herein. In certain configurations, a power amplifier system includes a power amplifier that provides amplification to an RF signal, a power management circuit that controls a voltage level of a supply voltage of the power amplifier, and a bias control circuit that biases the power amplifier. The power management circuit is operable in multiple supply control modes including, for example, an APT mode and an ET mode. The bias control circuit is configured to switch a bias of the power amplifier based on the supply control mode of the power management circuit.

In certain implementations, the power amplifier includes multiple bias networks that are controlled by the bias control circuit. Additionally, the bias control circuit activates one or more of the bias networks based on which supply control mode the power management circuit is operating. In one example, a particular bias network is activated in APT mode, and another bias network is activated in ET mode.

Changing or switching the activated bias networks can control the signal level of the power amplifier's bias. In certain implementations, switching the activated bias networks also controls a bias impedance of the power amplifier.

For example, different bias impedances can be provided by activating different combinations of bias networks. Additionally, the bias networks can be separately designed to optimize a particular supply control mode, for instance, by including circuitry for compensating for amplitude distortion (AM/AM) and/or phase distortion (AM/PM) associated with the mode.

Accordingly, a power amplifier can be designed to support multiple supply control modes, such as APT and ET modes, and operate with optimal or near optimal performance across such modes.

In certain implementations, the bias control circuit is implemented on a semiconductor die that includes a serial interface, such as a mobile industry processor interface radio frequency front-end (MIPI RFFE) bus. Additionally, switching of the bias of the power amplifier is controlled by a control command or word (for instance, a MIPI word) sent to the bias control circuit via the serial interface.

The switchable biasing schemes herein provide flexibility to optimize performance by allowing independent or separate biasing level and/or biasing impedance for each supply control mode. In one example, switchable biasing can enable the power amplifier to efficiently support full transmit power for both an APT mode and an ET mode. The biasing schemes herein can be applied to single stage power amplifiers, as well as to multi-stage power amplifiers that include two or more stages.

FIG. 1 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

Although the mobile device 800 illustrates one example of an RF system that can include one or more features of the present disclosure, the teachings herein are applicable to electronic systems implemented in a wide variety of ways.

The mobile device 800 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 1 as the transceiver 802. In one example, separate components (for instance, separate circuits or dies) can be provided for handling certain types of RF signals.

As shown in in FIG. 1, the transceiver 802 is connected to the front end system 803 and to the power management circuit 805 using a serial interface 809. All or part of the illustrated RF components can be controlled by the serial interface 809 to configure the mobile device 800 during initialization and/or while fully operational. In another embodiment, the baseband processor 801 is additionally or alternative connected to the serial interface 809 and operates to configure one or more RF components, such as components of the front end system 803 and/or power management system 805.

The front end system 803 aids is conditioning signals transmitted to and/or received from the antennas 804. In the illustrated embodiment, the front end system 803 includes one or more bias control circuits 810 for controlling power amplifier biasing, one or more power amplifiers (PAs) 811, one or more low noise amplifiers (LNAs) 812, one or more filters 813, one or more switches 814, and one or more duplexers 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 1, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a power amplifier (PA) supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

The power management system 805 can operate in a selectable supply control mode, such an APT mode or an ET mode. In the illustrated embodiment, the selected supply control mode of the power management system 805 is controlled by the transceiver 802. In certain implementations, the transceiver 802 controls the selected supply control mode using the serial interface 809.

As shown in FIG. 1, the power management system 805 receives a battery voltage from the battery 808. The battery 808 can be any suitable battery for use in the mobile device 800, including, for example, a lithium-ion battery. Although the power management system 805 is illustrated as separate from the front end system 803, in certain implementations all or part (for instance, a PA supply control circuit) of the power management system 805 is integrated into the front end system 803.

Figure 2A:
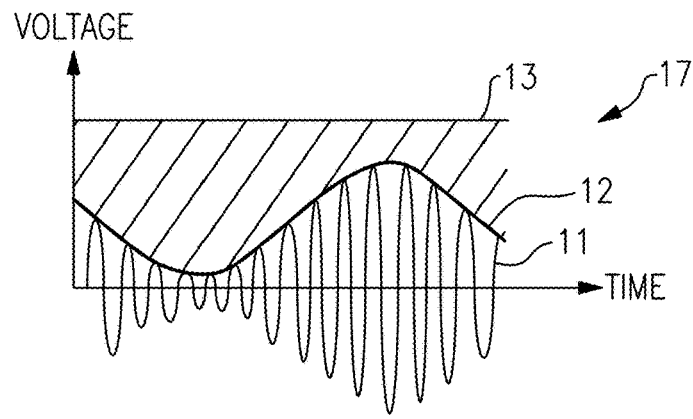
FIG. 2A is a graph showing a first example of power amplifier supply voltage versus time.

FIG. 2A is a graph 17 showing a first example of power amplifier supply voltage versus time. The graph 17 illustrates the voltage of an RF signal 11, the RF signal's envelope 12, and a power amplifier supply voltage 13 versus time. The graph 17 corresponds to one example of waveforms for an implementation in which the power amplifier supply voltage 13 is substantially fixed.

It can be important that the power amplifier supply voltage 13 of a power amplifier has a voltage greater than that of the RF signal 11. For example, powering a power amplifier using a power amplifier supply voltage that has a magnitude less than that of the RF signal can clip the RF signal, thereby creating signal distortion and/or other problems. Thus, it can be important the power amplifier supply voltage 13 be greater than that of the envelope 12. However, it can be desirable to reduce a difference in voltage between the power amplifier supply voltage 13 and the envelope 12 of the RF signal 11, as the area between the power amplifier supply voltage 13 and the envelope 12 can represent lost energy, which can reduce battery life and increase heat generated in a wireless device.

Figure 2B:
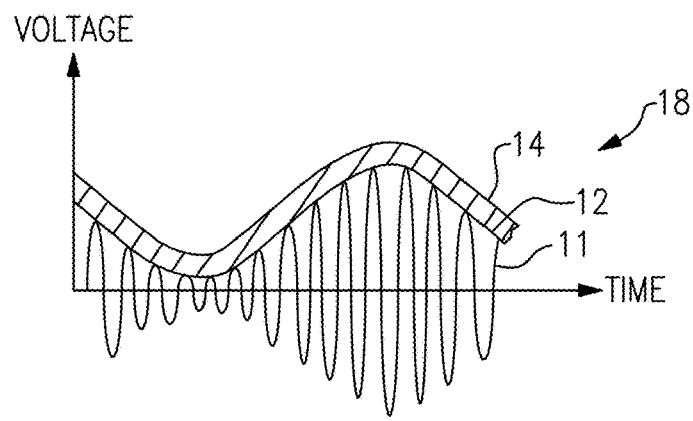
FIG. 2B is a graph showing a second example of power amplifier supply voltage versus time.

FIG. 2B is a graph 18 showing a second example of power amplifier supply voltage versus time. The graph 18 illustrates the voltage of an RF signal 11, the RF signal's envelope 12, and a power amplifier supply voltage 14 versus time. The graph 18 corresponds to one example of waveforms for an implementation in which the power amplifier supply voltage 14 is generated by envelope tracking.

Envelope tracking is a technique that can be used to increase power added efficiency (PAE) of a power amplifier system by efficiently controlling a voltage level of a power amplifier supply voltage in relation to an envelope of the RF signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

In contrast to the power amplifier supply voltage 13 of FIG. 2A, the power amplifier supply voltage 14 of FIG. 2B changes in relation to the envelope 12 of the RF signal 11. The area between the power amplifier supply voltage 14 and the envelope 12 in FIG. 2B is less than the area between the power amplifier supply voltage 13 and the envelope 12 in FIG. 2A, and thus the graph 18 of FIG. 2B can be associated with a power amplifier system having greater energy efficiency.

Figure 2C:
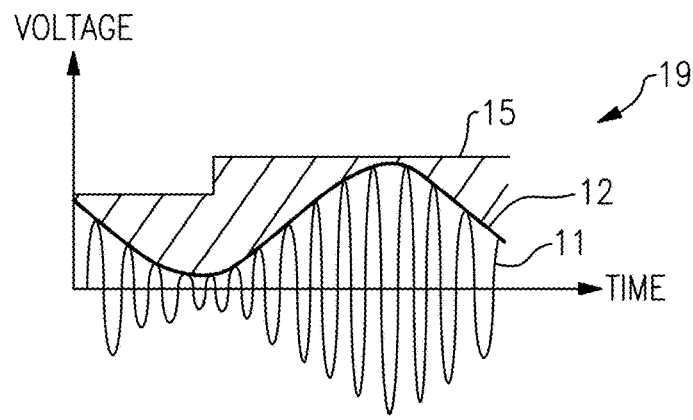
FIG. 2C is a graph showing a third example of power amplifier supply voltage versus time.

FIG. 2C is a graph 19 showing a third example of power amplifier supply voltage versus time. The graph 19 illustrates the voltage of an RF signal 11, the RF signal's envelope 12, and a power amplifier supply voltage 15 versus time. The graph 19 corresponds to one example of waveforms for an implementation in which the power amplifier supply voltage 15 is generated by average power tracking (APT).

APT is one technique for improving efficiency of a power amplifier, in which the voltage level of a power amplifier's supply voltage is controlled based on a power amplifier's average output power. When operating using APT, the voltage level of the power amplifier supply voltage can be substantially fixed for a particular time slot, but adjusted for a subsequent time slot based on average output power (for instance, transmission power control level). APT can achieve gain in efficiency relative to a fixed power amplifier supply voltage, but less efficiency gain compared to envelope tracking. However, envelope tracking can have a higher complexity, cost, and/or overhead relative to APT.

Figure 3:
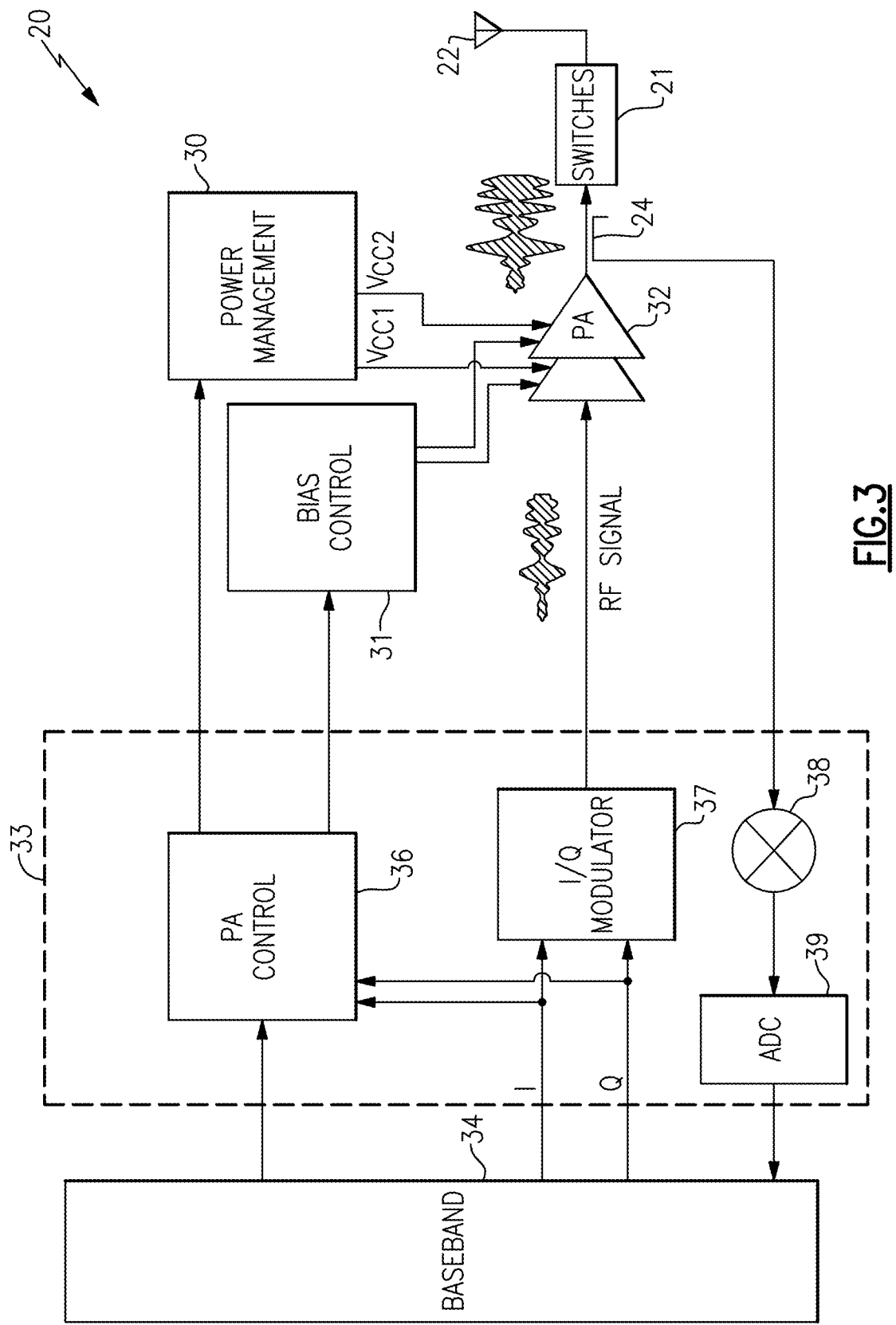
FIG. 3 is a schematic diagram of one embodiment of a power amplifier system.

FIG. 3 is a schematic diagram of one embodiment of a power amplifier system 20. The illustrated power amplifier system 20 includes switches 21, an antenna 22, a directional coupler 24, a power management circuit 30, a bias control circuit 31, a power amplifier 32, a transceiver 33, and a baseband processor 34.

Although FIG. 3 illustrates one embodiment of a power amplifier system, the teachings herein are applicable to power amplifier systems implemented in a wide variety of ways. For example, a power amplifier system can include more or fewer components, a different arrangement of components, and/or components implemented in different ways.

In the illustrated embodiment, the transceiver 33 includes a power amplifier control circuit 36, an I/Q modulator 37, a mixer 38, and an analog-to-digital converter (ADC) 39. Although not illustrated in FIG. 3 for clarity, the transceiver 33 can also process signals received from one or more antennas (for example, the antenna 22 and/or other antenna(s)) by way of one or more receive paths. Furthermore, the transceiver 33 can be implemented in other ways, including, but not limited to, using different implementations of transmit path(s), observation path(s), and/or power amplifier control circuitry.

The baseband signal processor 34 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 20.

The I/Q modulator 37 can be configured to receive the I and Q signals from the baseband processor 34 and to process the I and Q signals to generate an RF signal. For example, the I/Q modulator 37 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 32. In certain implementations, the I/Q modulator 37 can include one or more filters configured to filter frequency content of signals processed therein.

The power amplifier 32 can receive the RF signal from the I/Q modulator 37, and when enabled can provide an amplified RF signal to the antenna 22 via the switches 21. The directional coupler 24 can be positioned between the output of the power amplifier 32 and the input of the switches 21, thereby allowing an output power measurement of the power amplifier 32 that does not include insertion loss of the switches 21. However, other configurations of power measurement are possible.

In the illustrated configuration, the sensed output signal from the directional coupler 24 is provided to the mixer 38, which multiplies the sensed output signal by a reference signal of a controlled frequency. The mixer 38 operates to generate a downshifted signal by downshifting the sensed output signal's frequency content. The downshifted signal can be provided to the ADC 39, which can convert the downshifted signal to a digital format suitable for processing by the baseband processor 34. By including a feedback path between the output of the power amplifier 32 and the baseband processor 34, the baseband processor 34 can be configured to dynamically adjust the I and Q signals to optimize the operation of the power amplifier system 20. For example, configuring the power amplifier system 20 in this manner can aid in controlling the PAE and/or linearity of the power amplifier 32.

In the illustrated embodiment, the power management circuit 30 receives a power control signal from the transceiver 33, and controls the supply voltages of the power amplifier 32. In certain implementations, the transceiver 33 is electrically connected to the power management circuit 30 via a serial interface, and the power management circuit 30 receives the power control signal over the serial interface.

As shown in FIG. 3, the power management circuit 30 generates a first supply voltage $V_{CC1}$ for powering an input stage of the power amplifier 32 and a second supply voltage $V_{CC2}$ for powering an output stage of the power amplifier 32. The power management circuit 30 can control the voltage level of the first supply voltage $V_{CC1}$ and/or the second supply voltage $V_{CC2}$ to enhance the power amplifier system's PAE. Although an embodiment with two controllable supply voltages is shown, a power management circuit can control the voltage levels of more or fewer supply voltages. In certain implementations, a power amplifier operates with one or more controllable supply voltages and one or more substantially fixed supply voltages.

In the illustrated embodiment, the power control signal instructs the power management circuit 30 to operate in a particular supply control mode, such as an APT mode or an ET mode. Thus, the power amplifier control circuit 36 of the transceiver 33 controls the selected supply control mode, in this embodiment.

As shown in FIG. 3, the bias control circuit 31 receives a bias control signal from the transceiver 33, and generates bias control signals for the power amplifier 32. Additionally, the bias control circuit 31 generates the bias control signals based on the bias control signal.

The bias control signal identifies the supply control mode that the power management circuit 30 is operating in, and the bias control circuit 31 generates the bias control signals based on the indicated supply control mode. In certain implementations, the transceiver 33 is electrically connected to the bias control circuit 31 via a serial interface, and the bias control circuit 31 receives a control word that indicates the selected supply control mode over the serial interface.

Figure 4:
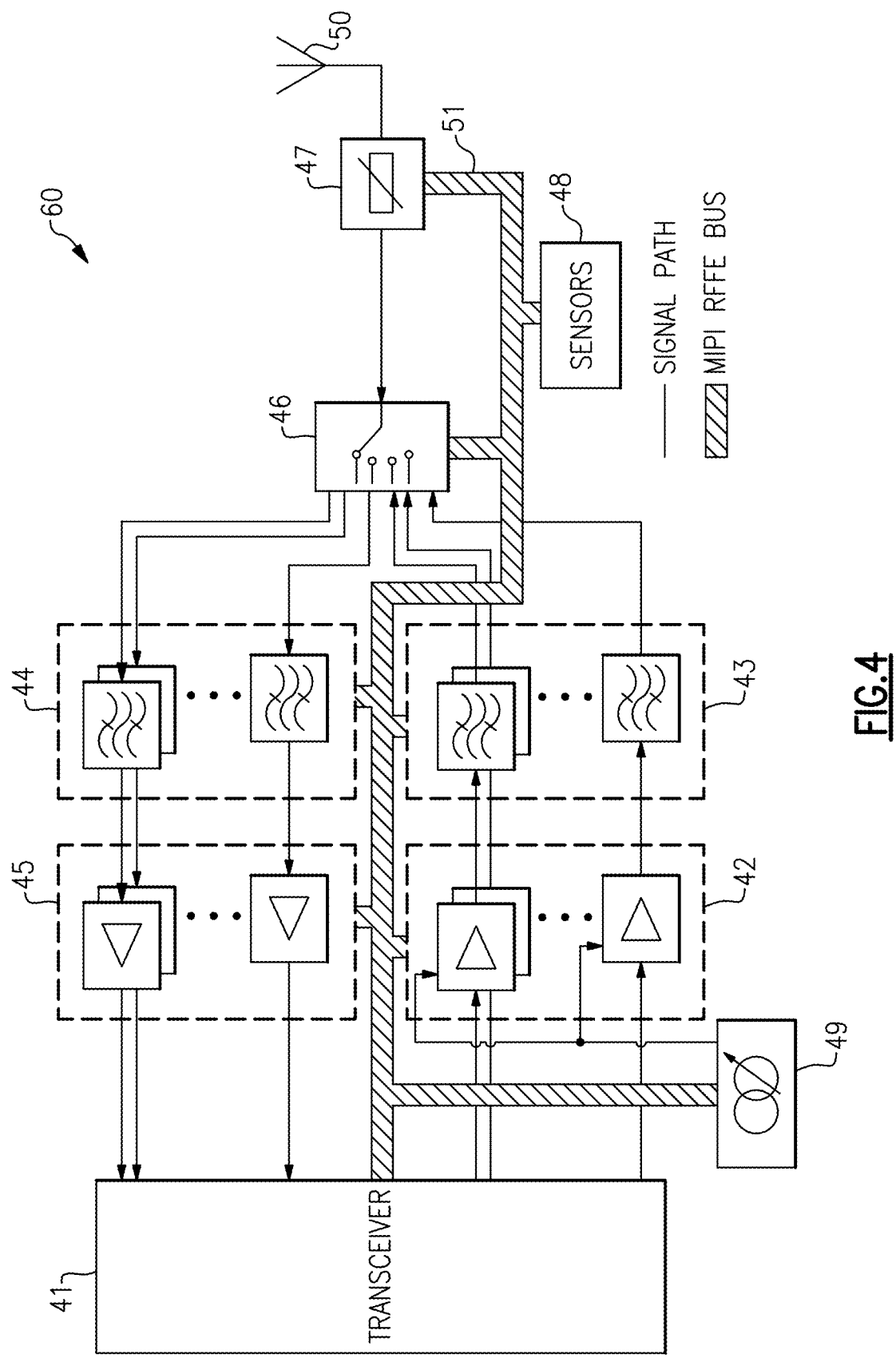
FIG. 4 is a schematic diagram of one embodiment of an RF communication system.

FIG. 4 is a schematic diagram of one embodiment of an RF communication system 60 including a MIPI RFFE bus 51. The RF communication system 60 further includes a transceiver 41, a power amplifier module 42, a transmit filter module 43, a receive filter module 44, a low noise amplifier (LNA) module 45, an antenna switch module 46, a coupler module 47, a sensor module 48, a power management module 49, and an antenna 50.

As shown in FIG. 4, various components of the RF communication system 60 are interconnected by the MIPI RFFE bus 51. Additionally, the transceiver 41 includes a master device of the MIPI RFFE bus 51, and each of the RF components includes a slave device of the MIPI RFFE bus 51. The master device of the transceiver 41 sends control commands over the MIPI RFFE bus 51 to configure the RF communication system 60 during initialization and/or while operational.

The power amplifier module 42 can include a power amplifier and a bias control circuit that controls biasing of the power amplifier. Additionally, the bias control circuit can include a slave device of the MIPI RFFE bus 51. The power amplifier module 42 can be implemented in accordance with one or more features of the present disclosure. As shown in FIG. 4, the power amplifier module 42 receives one or more power amplifier supply voltages from the power management module 49.

Although FIG. 4 illustrates one example of an RF communication system that can include a power amplifier module controlled over a serial interface, the teachings herein are applicable to RF communication systems implemented in a wide variety of ways.

Figure 5A:
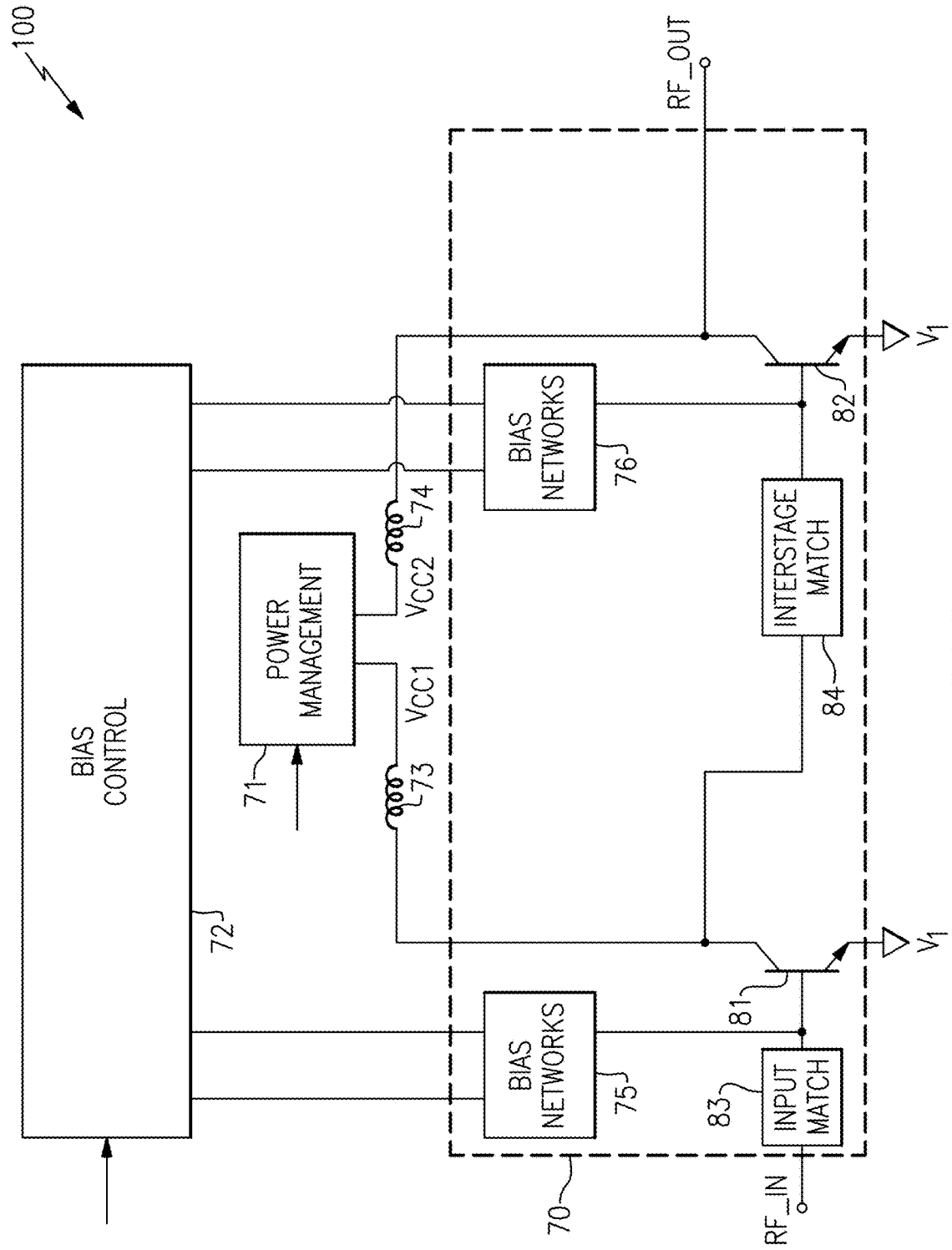
FIG. 5A is a schematic diagram of another embodiment of a power amplifier system.

FIG. 5A is a schematic diagram of another embodiment of a power amplifier system 100. The power amplifier system 100 includes a power amplifier 70, a power management circuit 71, a bias control circuit 72, a first supply inductor 73, and a second supply inductor 74.

Although FIG. 5A illustrates one embodiment of a power amplifier system including a switchable bias, the teachings herein are applicable to power amplifier systems implemented in a wide variety of ways.

The power amplifier 70 includes input stage bias networks 75, output stage bias networks 76, an input stage bipolar transistor 81, an output stage bipolar transistor 82, an input matching circuit 83, and an interstage matching circuit 84.

Although the illustrated power amplifier 70 includes two stages, other configurations are possible, including, for example, power amplifiers including one stage or power amplifiers including three or more stages. Although the illustrated power amplifier 70 is implemented using bipolar transistors, the teachings herein are also applicable to field-effect transistor configurations.

As shown in FIG. 5A, the power amplifier 70 receives an RF input signal RF_IN, which is amplified using the input stage bipolar transistor 81. A collector of the input stage bipolar transistor 81 generates an amplified RF signal, which is provided to a base of the output stage bipolar transistor 82. The output stage bipolar transistor 82 further amplifies the amplified RF signal to generate the RF output signal RF_OUT. As shown in FIG. 5A, the emitters of the input stage bipolar transistor 81 and output stage bipolar transistor 82 are electrically connected to a first voltage $V_1$, which can be, for example, a ground voltage.

As will be appreciated by persons having ordinary skill in the art, the input matching circuit 83 and the interstage matching circuit 84 provide impedance matching, thereby enhancing RF performance. Although not shown in FIG. 5A, the power amplifier 70 can include an output matching circuit and/or one or more harmonic termination circuits.

The power amplifier 70 of FIG. 5A is powered using a first supply voltage $V_{CC1}$ and a second supply voltage $V_{CC2}$. The first supply inductor 73 is electrically connected between the first supply voltage $V_{CC1}$ and the collector of the input stage bipolar transistor 81, and the second supply inductor 74 is electrically connected between the second supply voltage $V_{CC2}$ and the collector of the output stage bipolar transistor 82. The first supply inductor 73 and the second supply inductor 74 can aid in powering the power amplifier 70, while providing impedance sufficient to block RF signals generated by the power amplifier 70 from reaching the supply voltages $V_{CC1}$, $V_{CC2}$.

The power management circuit 71 is operable in supply control modes, including an APT mode and an ET mode. Additionally, the power management circuit 71 receives a power control signal that instructs the power management circuit 71 to operate in a selected supply control mode. In one embodiment, the power control signal is received over a serial interface, such as a MIPI RFFE bus.

As shown in FIG. 5A, the power management circuit 71 generates a first supply voltage $V_{CC1}$ for powering the input stage bipolar transistor 81 of the power amplifier 70 and a second supply voltage $V_{CC2}$ for powering the output stage bipolar transistor 82 of the power amplifier 70.

The power management circuit 71 controls the voltage levels of the first supply voltage $V_{CC1}$ and/or the second supply voltage $V_{CC2}$ based on the selected supply control mode. In one example, when the selected supply control mode is an ET mode, the power management circuit 71 controls the voltage levels of the first supply voltage $V_{CC1}$ and/or the second supply voltage $V_{CC2}$ to track a signal envelope of the signal RF_IN amplified by the power amplifier 70. In another example, when the selected supply control mode is an ET mode, the power management circuit 71 controls the voltage levels of the first supply voltage $V_{CC1}$ and/or the second supply voltage $V_{CC2}$ based on an average output power of the power amplifier 70.

The input stage bias networks 75 control biasing of the input stage bipolar transistor 81. As shown in FIG. 5A, the bias control circuit 72 controls the input stage bias networks 75 to thereby control the transistor's biasing. In the illustrated embodiment, the bias control circuit 72 controls a signal level of the bias signal generated by the input stage bias networks 75 and an impedance of the input stage bias networks 75.

With continuing reference to FIG. 5A, the output stage bias networks 76 control biasing of the output stage bipolar transistor 82. Additionally, the bias control circuit 72 controls the output stage bias networks 76 to thereby control the transistor's biasing. In the illustrated embodiment, the bias control circuit 72 controls a signal level of the bias signal generated by the output stage bias networks 76 and an impedance of the output stage bias networks 76.

As shown in FIG. 5A, the bias control circuit 72 receives a bias control signal, which includes information indicating the selected supply control mode of the power management circuit 71. Additionally, the bias control circuit 72 generates the bias control signals for controlling the input stage bias networks 75 and output stage bias networks 76 based on the received bias control signal. In one embodiment, the power control signal is received over a serial interface, such as a MIPI RFFE bus.

The power amplifier 70 includes multiple bias networks for biasing the input stage bipolar transistor 81 and for biasing the output stage bipolar transistor 82. In the illustrated embodiment, the input stage bias networks 75 include two or more bias networks that are individually activatable, and the output stage bias networks 76 include two or more bias networks that are individually activatable. Additionally, the bias control circuit 72 controls activation of the bias networks based on the selected supply control mode of the power management circuit 71. In one example, a first group of bias networks is activated in APT mode, and another group of bias networks is activated in ET mode.

Changing or switching the activated bias networks can control the bias signal level of the input stage bipolar transistor 81 and the output stage bipolar transistor 82. Additionally, switching the activated bias networks also controls a bias impedance of the input stage bipolar transistor 81 and the output stage bipolar transistor 82. For example, different bias impedances can be provided by activating different combinations of the bias networks associated with the input stage bias networks 75 and the output stage bias networks 76.

Accordingly, the bias networks of the power amplifier 70 can be designed to support multiple supply control modes, such as APT and ET modes. Additionally, the power amplifier can operate with optimal or near optimal performance across multiple supply control modes. Thus, flexibility is provided by allowing independent or separate biasing level and biasing impedance for each supply control mode. In one example, the power amplifier 70 supports full transmit power for both an APT mode and an ET mode.

Figure 5B:
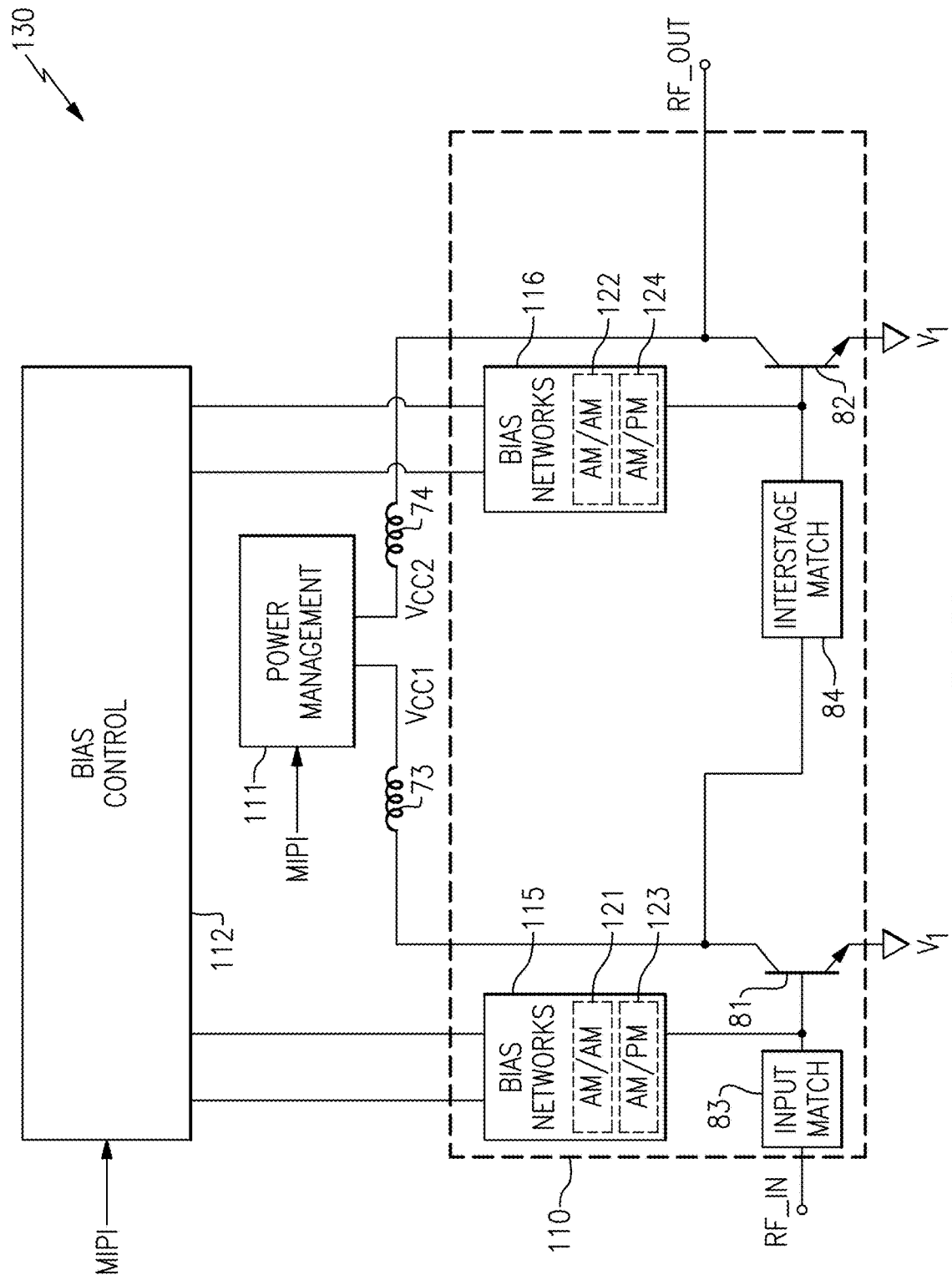
FIG. 5B is a schematic diagram of another embodiment of a power amplifier system.

FIG. 5B is a schematic diagram of another embodiment of a power amplifier system 130. The power amplifier system 130 includes a power amplifier 110, a power management circuit 111, a bias control circuit 112, a first supply inductor 73, and a second supply inductor 74.

As shown in FIG. 5B, the power management circuit 111 and the bias control circuit 112 receive control words over a serial interface or bus. The control words can indicate a selected supply control mode, such as an ET mode or an APT mode. Although an example showing a MIPI RFFE bus is shown, other types of buses or interfaces can be used, for instance, an inter-integrated circuit (I$^2$C) bus.

The power amplifier 110 of FIG. 5B is similar to the power amplifier 70 of FIG. 5A, except that the power amplifier 110 of FIG. 5B illustrates an implementation of bias networks including compensation for amplitude distortion (AM/AM) and phase distortion (AM/PM).

For example, the power amplifier 110 includes input stage bias networks 115 controlled by the bias control circuit 112 and used to bias the input stage bipolar transistor 81. As shown in FIG. 5B the input stage bias networks 115 include an amplitude distortion compensation circuit 121 and a phase distortion compensation circuit 123. As the selected supply control mode is changed, the bias control circuit 112 switches which of the input stage bias networks 110 are activated. Additionally, the amplitude distortion compensation circuit 121 and the phase distortion compensation circuit 123 can provide desired expansion or compression desired for a particular mode, thereby providing compensation.

Similarly, the power amplifier 110 includes output stage bias networks 116 controlled by the bias control circuit 112 and used to bias the output stage bipolar transistor 82. As shown in FIG. 5B the output stage bias networks 116 includes an amplitude distortion compensation circuit 122 and a phase distortion compensation circuit 124. As the selected supply control mode is changed, the bias control circuit 112 switches which of the output stage bias networks 116 are activated. Additionally, the amplitude distortion compensation circuit 122 and the phase distortion compensation circuit 124 can provide desired expansion or compression desired for a particular mode.

Accordingly, the bias networks of the power amplifier 110 can be separately designed to optimize a particular supply control mode, including providing compensation for amplitude distortion and/or phase distortion associated with the mode.

Additional details of the power amplifier system 130 of FIG. 5B can be similar to those of the power amplifier system 100 of FIG. 5A.

Figure 5C:
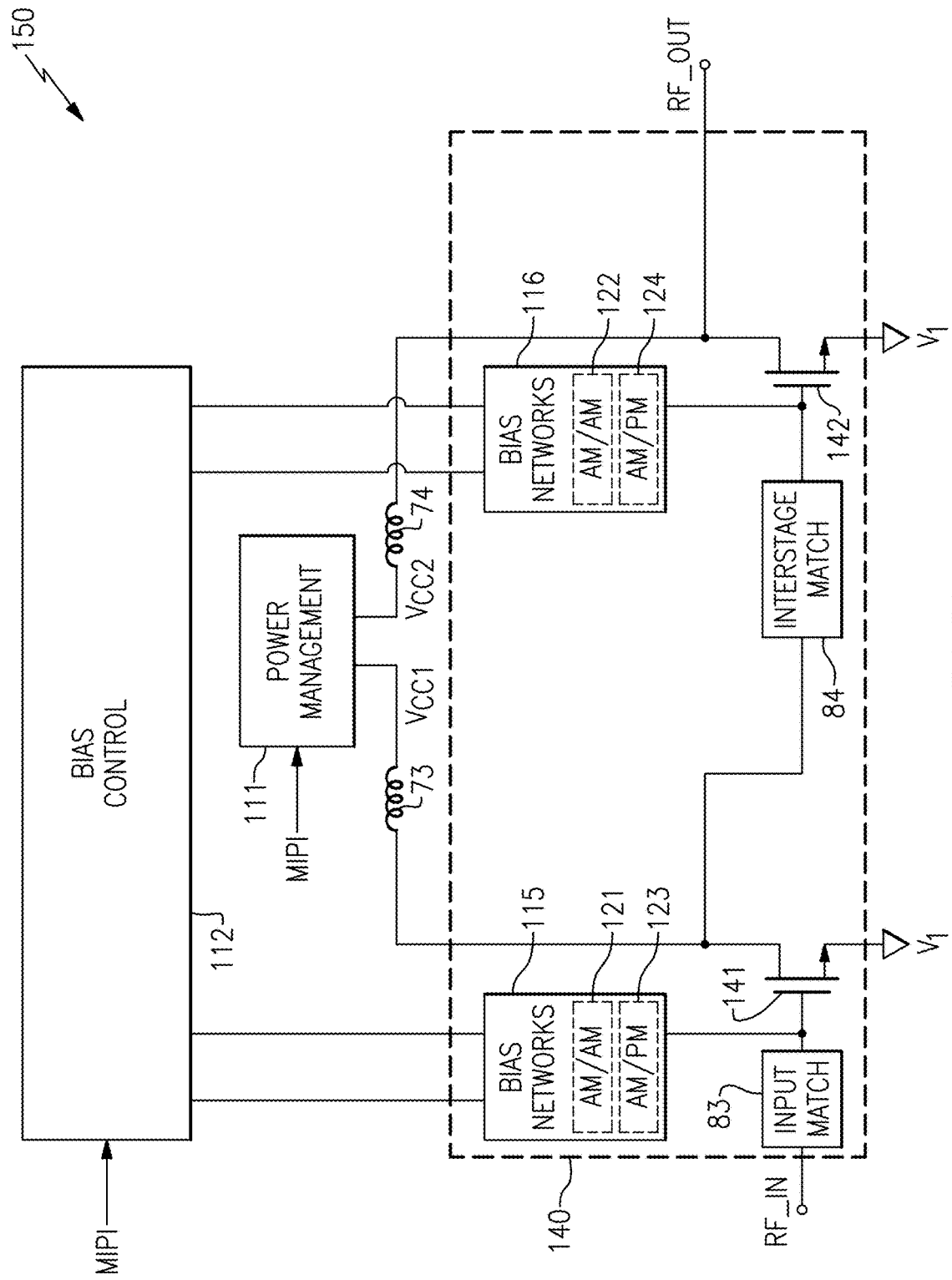
FIG. 5C is a schematic diagram of another embodiment of a power amplifier system.

FIG. 5C is a schematic diagram of another embodiment of a power amplifier system 150. The power amplifier system 150 includes a power amplifier 140, a power management circuit 111, a bias control circuit 112, a first supply inductor 73, and a second supply inductor 74.

The power amplifier system 150 of FIG. 5C is similar to the power amplifier system 130 of FIG. 5B, except that the power amplifier system 150 includes a power amplifier implemented using field-effect transistors. For example, the power amplifier 140 includes an input stage FET 141 and an output stage FET 142. As shown in FIG. 5C, a gate of the input stage FET 141 is biased by the input stage bias networks 115, and a drain of the input stage FET 141 is powered by the first supply voltage $V_{CC1}$ from the power management circuit 111. Additionally, a gate of the output stage FET 142 is biased by the output stage bias networks 116, and a drain of the output stage FET 142 is powered by the second supply voltage $V_{CC2}$.

The teachings herein are applicable to power amplifiers using a wide variety of transistor types, including, bipolar transistors, FETs, or a combination thereof. Although examples using common-emitter and common-source stages have been shown, power amplifier stages can be implemented in other ways, including, but not limited to, using cascode amplifier stages.

Figure 6:
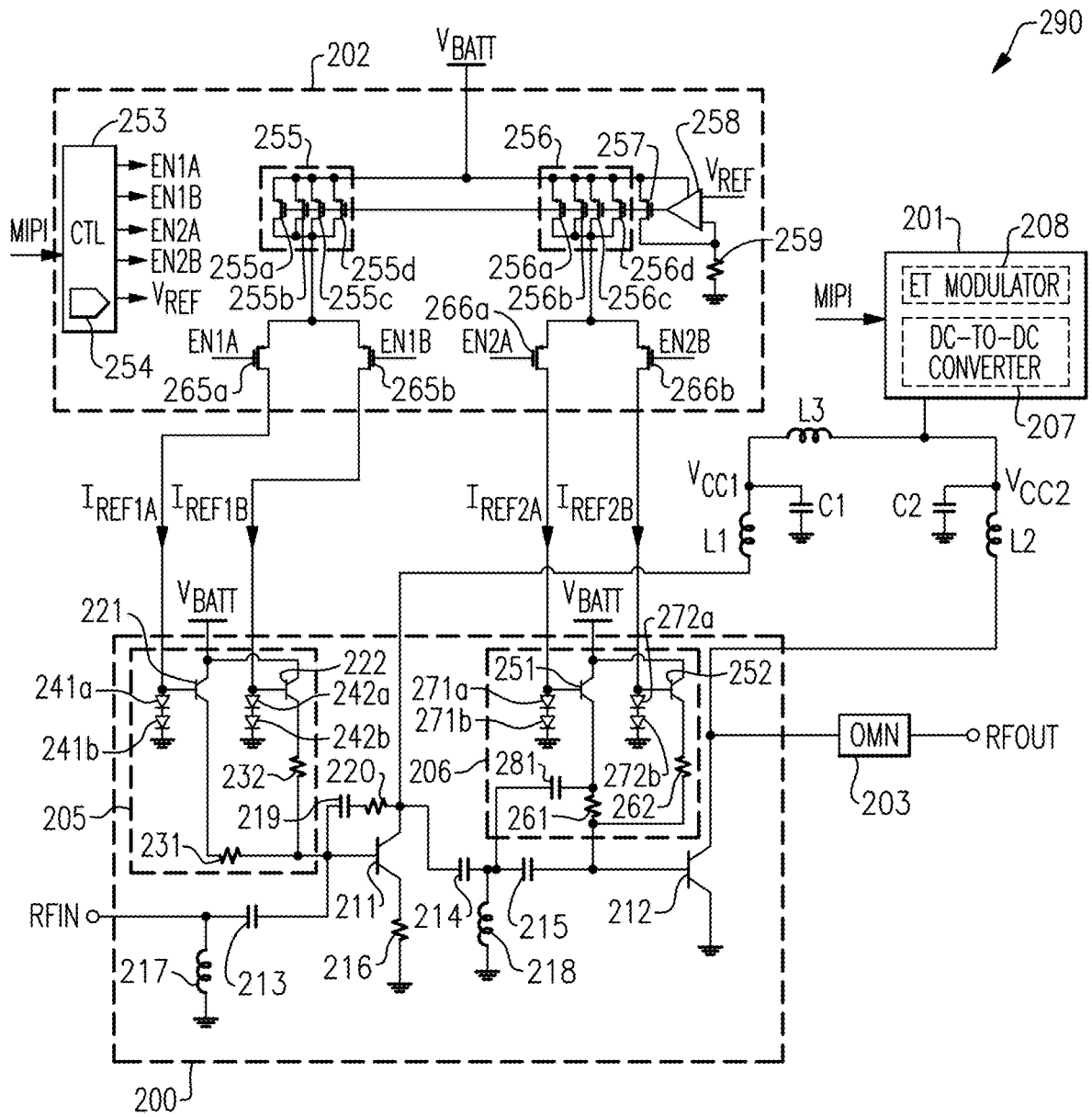
FIG. 6 is a schematic diagram of another embodiment of a power amplifier system.

FIG. 6 is a schematic diagram of another embodiment of a power amplifier system 290. The power amplifier system 290 includes a power amplifier 200, a power management circuit 201, a bias control circuit 202, a first supply inductor L1, a second supply inductor L2, a third supply inductor L3, a first decoupling capacitor C1, a second decoupling capacitor C2, and an output matching network (OMN) 203.

The illustrated power management circuit 201 includes a DC-to-DC converter 207 for average power tracking and an ET modulator 208 for envelope tracking. The power management circuit 201 receives a power control signal indicating the selected supply control mode. In the illustrated embodiment, the selected supply control mode is chosen from amongst multiple supply control modes including an APT mode in which the DC-to-DC converter 207 controls the outputted power amplifier supply voltage and an ET mode in which the ET modulator 208 controls the outputted power amplifier supply voltage. The power control signal is received by a serial interface (for example, a MIPI interface), in this embodiment.

The bias control circuit 202 includes control circuitry 253, a first reference current source 255, a second reference current source 256, a reference transistor 257, an amplifier 258, a resistor 259, input bias selection transistors 265a-265b, and output bias selection transistors 266a-266b.

With continuing reference to FIG. 6, the control circuitry 253 of the bias control circuit 202 receives a bias control signal that indicates the selected supply control mode (for example, ET mode, APT mode, or another mode, such as a fixed mode in which the supply control voltage is substantially fixed). In the illustrated embodiment, the bias control signal is received by a serial interface (MIPI, in this example). Based on the selected supply control mode, the control circuitry 253 controls enable signals EN1A, EN1B for the power amplifier's input stage and enable signals EN2A, EN2B for the power amplifier's output stage. As shown in FIG. 6, the enable signals EN1A, EN1B operate to control the input bias selection transistors 265a-265b, and the enable signals EN2A, EN2B operate to control the output bias selection transistors 266a-266b.

In certain implementations, the bias control signal receive over the serial interface also provides other biasing information. In one example, the control circuitry 253 includes a DAC 254 used to generate a reference voltage $V_{REF}$ for controlling the magnitude of the reference currents generated by the bias control circuit 202, and the bias control signal includes data for controlling a digital input value to the DAC 254.

When a particular enable signal is activated, a reference current flows from the bias control circuit 202 to a corresponding bias network of the power amplifier 200. For a particular power amplifier stage (input stage and output stage, in this example), the bias control circuit 202 can deactivate both reference currents to turn off the power amplifier stage, activate one of the reference currents to activate one bias network, or activate both reference currents to activate both bias networks. By controlling activation of the bias networks, a bias signal level and bias impedance of the corresponding power amplifier stage can be controlled.

As shown in FIG. 6, the reference currents are generated by reference current sources that are each implemented as an array of field-effect transistors, in this embodiment. For example, the first reference current source 255 is implemented using a first array of transistors 255a-255d, and the second reference current source 256 is implemented using a second array of transistors 256a-256d.

In certain implementations, the amount of reference current generated by a reference current source is controllable (for instance, using the DAC 254 to control the reference voltage $V_{REF}$, in this embodiment). In one embodiment, a reference current source is controlled to provide more reference current when providing current to two bias networks relative to when the reference current source is providing current to one bias network.

The power amplifier 200 includes various circuitry, including an input stage bipolar transistor 211, an output stage bipolar transistor 212, input stage bias networks 205, output stage bias networks 206, a first DC blocking capacitor 213, a second DC blocking capacitor 214, a third DC blocking capacitor 215, a degeneration resistor 216, a first shunt inductor 217, a second shunt inductor 218, a feedback capacitor 219, and a feedback resistor 220.

The input stage bias networks 205 include a first bias network and a second bias network. The first bias network includes a first bipolar transistor 221, a first resistor 231, and a first string of diodes 241a-241b. The second bias network includes a second bipolar transistor 222, a second resistor 232, and a second string of diodes 242a-242b. Thus, the input stage bias networks 205 includes two bias networks, in this embodiment. The first and second bias networks can be implemented differently (for instance, using different component sizes) to achieve desired biasing.

With continuing reference to FIG. 6, the output stage bias networks 206 include a first bias network and a second bias network. The first bias network includes a first bipolar transistor 251, a first resistor 261, a first string of diodes 271a-271b, and a feedforward capacitor 281. Additionally, the second bias network includes a second bipolar transistor 252, a second resistor 262, and a second string of diodes 272a-272b. Thus, the output stage bias networks 206 includes two bias networks, in this embodiment.

When the bias control circuit 202 provides a reference current to a particular bias network, the bias network is activated. For example, enabling the reference current $I_{REF1A}$ activates the first bias network of the input stage bias networks 205, and enabling the current $I_{REF1B}$ activates the second bias network of the input stage bias networks 205. Similarly, enabling the reference current $I_{REF2A}$ activates the first bias network of the output stage bias networks 206, and enabling the current $I_{REF2B}$ activates the second bias network of the output stage bias networks 206. However, when the bias control circuit 202 does not enable the reference current to a particular bias network, that bias network is deactivated.

Changing or switching the activated bias networks can control the bias signal level of the input stage bipolar transistor 211 and the output stage bipolar transistor 212. Additionally, switching the activated bias networks also controls a bias impedance of the input stage bipolar transistor 211 and the output stage bipolar transistor 212. For example, different bias impedances can be provided by activating different combinations of the bias networks associated with the input stage bias networks 205 and the output stage bias networks 206.

The selected combination of bias networks that are activated for a particular supply control mode can be selected in a variety of ways. In one example, one bias network from the input bias networks 205 and one bias network from the output bias networks 206 is activated in ET mode, and the other bias network from the input bias networks 205 and the other bias network from the output bias networks 206 is activated in APT mode. However, other implementations are possible, including, for example, implementations in which multiple bias networks are activated for a particular supply control mode. Moreover, the teachings here are also applicable to configurations in which the activated bias networks are selected based not only on selected supply control, but additionally based on transmit power level, such as whether or not the power amplifier operates at full transmit power.

The bias networks of the power amplifier 200 can be designed to support multiple supply control modes, such as APT and ET modes. Additionally, the power amplifier 200 can operate with optimal or near optimal performance across multiple supply control modes. Thus, flexibility is provided by allowing independent or separate biasing level and biasing impedance for each supply control mode.

The power amplifier's bias networks can also be implemented with circuitry for providing compensation for amplitude distortion and/or phase distortion. For example, in the illustrated embodiment, the feedforward capacitor 281 is provided for providing gain expansion in one mode (for instance, ET mode) relative to another mode (for instance, APT mode).

In one embodiment, the power amplifier 200 is implemented on a first semiconductor die of a first module, the bias control circuit 202 is implemented on a second semiconductor die of the first module, and the power management circuit 201 is implemented on one or more semiconductor dies of a second module.

Although FIG. 6 illustrates one embodiment of a power amplifier system, the teachings herein are applicable to power amplifier systems implemented in a wide variety of ways. Accordingly, although specific implementations of a power amplifier, a bias control circuit, and a power management circuit are shown, other implementations are possible.

Figure 7A:
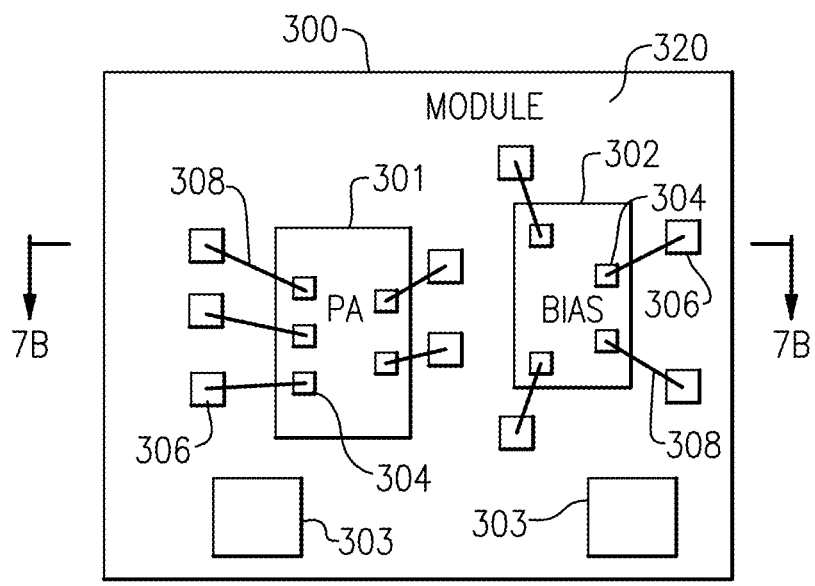
FIG. 7A is a schematic diagram of one embodiment of a packaged module.
Figure 7B:
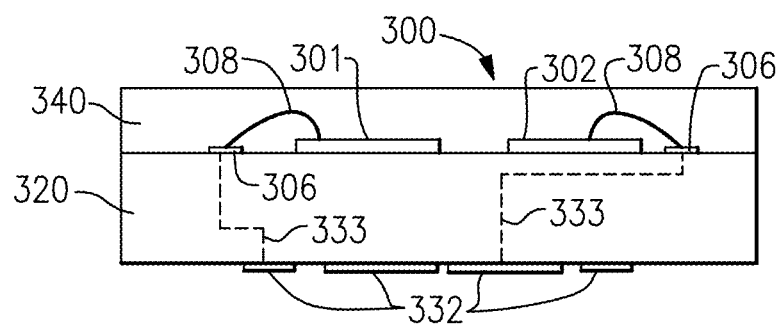
FIG. 7B is a schematic diagram of a cross-section of the packaged module of FIG. 7A taken along the lines 7B-7B.

FIG. 7A is a schematic diagram of one embodiment of a packaged module 300. FIG. 7B is a schematic diagram of a cross-section of the packaged module 300 of FIG. 7A taken along the lines 7B-7B.

The packaged module 300 includes a power amplifier die 301, a bias control die 302, surface mount components 303, wirebonds 308, a package substrate 320, and encapsulation structure 340. The package substrate 320 includes pads 306 formed from conductors disposed therein. Additionally, the dies 301, 302 include pads 304, and the wirebonds 308 have been used to connect the pads 304 of the dies 301, 302 to the pads 306 of the package substrate 320.

The power amplifier die 301 and the bias control die 302 are implemented in accordance with one or more features of the present disclosure. In certain implementations, the packaged module 300 includes a supply pin or pad for receiving a supply voltage from an external power management circuit. Additionally, the bias die 302 includes a bias control circuit that switches a bias of the power amplifier die 301 based on the supply control mode of the external power management circuit. The bias die 302 can include a serial interface, such as a MIPI RFFE bus, used to receive a control signal indicating the supply control mode of the external power management circuit.

In certain implementations, the dies 301, 302 are manufactured using different processing technologies. In one example, the power amplifier die 301 is manufactured using a heterojunction bipolar transistor (HBT) process, and the bias control die 302 is manufactured using a complementary metal oxide semiconductor (CMOS) process.

The packaging substrate 320 can be configured to receive a plurality of components such as the dies 301, 302 and the surface mount components 303, which can include, for example, surface mount capacitors and/or inductors.

As shown in FIG. 7B, the packaged module 300 is shown to include a plurality of contact pads 332 disposed on the side of the packaged module 300 opposite the side used to mount the dies 301, 302. Configuring the packaged module 300 in this manner can aid in connecting the packaged module 300 to a circuit board such as a phone board of a wireless device. The example contact pads 332 can be configured to provide RF signals, bias signals, power low voltage(s) and/or power high voltage(s) to the dies 301, 302 and/or the surface mount components 303. As shown in FIG. 7B, the electrically connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling of the packaged module 300. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Applications

Some of the embodiments described above have provided examples in connection with wireless devices or mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a power amplifier including a field-effect transistor configured to amplify a radio frequency signal, and a plurality of bias networks including a first bias network electrically connected to a gate of the field-effect transistor and a second bias network electrically connected to the gate of the field-effect transistor;
a power management circuit configured to control a voltage level of a supply voltage of the power amplifier, the power management circuit operable in a selected supply control mode chosen from a plurality of supply control modes; and
a bias control circuit configured to switch a bias of the power amplifier based on the selected supply control mode of the power management circuit, the bias control circuit configured to control a first reference current to the first bias network and a second reference current to the second bias network based on the selected supply control mode.

2. The mobile device of claim 1 wherein the plurality of supply control modes includes an average power tracking mode and an envelope tracking mode.

3. The mobile device of claim 1 wherein the bias control circuit is operable to control a bias impedance of the power amplifier based on the selected supply control mode, the power amplifier having a different bias impedance in a first supply control mode relative to a second supply control mode.

4. The mobile device of claim 1 wherein the bias control circuit is configured to receive a control signal indicating the selected supply control mode of the power management circuit.

5. The mobile device of claim 4 wherein the bias control circuit is configured to receive the control signal over a serial interface.

6. The mobile device of claim 1 wherein the bias control circuit includes a first reference current source configured to provide the first reference current to the first bias network through a first switch, and the second reference current to the second bias network through a second switch, the first switch and the second switch selectively activated based on the selected supply control mode.

7. The mobile device of claim 1 wherein the bias control circuit selectively activates different combinations of the plurality of bias networks based on the selected supply control mode.

8. The mobile device of claim 1 wherein the first bias network is activated in a first supply control mode and deactivated in a second supply control mode, the first bias network including a distortion compensation circuit.

9. The mobile device of claim 1 wherein the bias control circuit further includes a digital-to-analog converter configured to generate a reference voltage operable to control a magnitude of the first reference current and a magnitude of the second reference current.

10. A packaged module comprising:
a package substrate;
a supply pin configured to receive a supply voltage from an external power management circuit;
a first die attached to the package substrate and including a power amplifier, the power amplifier including a field-effect transistor configured to amplify a radio frequency signal, and a plurality of bias networks including a first bias network electrically connected to a gate of the field-effect transistor and a second bias network electrically connected to the gate of the field-effect transistor; and
a second die attached to the package substrate and including a bias control circuit configured to switch a bias of the power amplifier based on a control signal indicating a selected mode of controlling the supply voltage, the bias control circuit configured to control a first reference current to the first bias network and a second reference current to the second bias network based on the selected mode.

11. The packaged module of claim 10 wherein the selected mode indicates one of an average power tracking mode or an envelope tracking mode.

12. The packaged module of claim 10 wherein the bias control circuit is operable to control a bias impedance of the power amplifier based on the selected mode, the power amplifier having a different bias impedance in a first mode of controlling the supply voltage relative to a second mode of controlling the supply voltage.

13. The packaged module of claim 10 wherein the second die includes a serial interface configured to receive the control signal.

14. The packaged module of claim 10 wherein the bias control circuit includes a first reference current source configured to provide the first reference current to the first bias network through a first switch, and the second reference current to the second bias network through a second switch, the first switch and the second switch selectively activated based on the selected mode.

15. The packaged module of claim 10 wherein the first bias network is activated in a first mode of controlling the supply voltage and deactivated in a second mode of controlling the supply voltage, the first bias network including a distortion compensation circuit.

16. A method of power amplifier biasing, the method comprising:
amplifying a radio frequency signal using a field-effect transistor of a power amplifier, the power amplifier including a plurality of bias networks including a first bias network electrically connected to a gate of the field-effect transistor and a second bias network electrically connected to the gate of the field-effect transistor;
controlling a voltage level of a supply voltage of the power amplifier using a power management circuit;
operating the power management circuit in a selected supply control mode chosen from a plurality of supply control modes; and
switching a bias of the power amplifier based on the selected supply control mode using a bias control circuit, including controlling a first reference current to the first bias network and a second reference current to the second bias network based on the selected supply control mode.

17. The method of claim 16 further comprising controlling a bias impedance of the power amplifier based on the selected supply control mode using the bias control circuit, including operating the power amplifier with a different bias impedance in a first supply control mode relative to a second supply control mode.

18. The method of claim 16 further comprising receiving a control signal indicating the selected supply control mode over a serial interface.

19. The method of claim 16 wherein switching the bias of the power amplifier includes selectively activating one or more of the plurality of bias networks of the power amplifier based on the selected supply control mode.

20. The method of claim 16 further comprising activating different combinations of the plurality of bias networks based on the selected supply control mode.

* * * * *